United States Patent
Shih et al.

(10) Patent No.: US 6,346,303 B1
(45) Date of Patent: Feb. 12, 2002

(54) PROCESS FOR SYNTHESIZING ONE-DIMENSIONAL NANOSUBSTANCES BY ELECTRON CYCLOTRON RESONANCE CHEMICAL VAPOR DEPOSITION

(76) Inventors: Han-Chang Shih; Shing-Li Sung; Shang-Hua Tsai, all of No. 101, Sec. 2, Kuang-Fu Rd., Hsinchu (TW)

( * ) Notice: Subject to any disclaimer, the term of this patent is extended or adjusted under 35 U.S.C. 154(b) by 0 days.

(21) Appl. No.: 09/311,598

(22) Filed: May 14, 1999

(30) Foreign Application Priority Data

Jan. 11, 1999 (TW) ........................................ 88100434 A (51) Int. Cl.[7] ............................ H05H 1/18; C23C 16/32; C23C 16/36
(52) U.S. Cl. ................. 427/571; 427/575; 427/577; 427/249.1; 427/249.4; 427/249.394
(58) Field of Search ................ 427/571, 575, 427/249.1, 255.394, 577, 249.4

(56) References Cited

U.S. PATENT DOCUMENTS 5,779,802 A * 7/1998 Borghs et al. ........ 118/723 MP
6,063,243 A * 5/2000 Zettl et al. ................... 204/164
6,157,043 A * 12/2000 Miyamoto ..................... 257/22

FOREIGN PATENT DOCUMENTS

JP     411139821 A  *  5/1999

* cited by examiner

Primary Examiner—Bret Chen
(74) Attorney, Agent, or Firm—Nath & Associates PLLC; Harold L. Novick; Marvin C. Berkowitz (57) ABSTRACT

The present invention provides a process for synthesizing one-dimensional nanosubstances. A membrane having channels serves as the host material for the synthesis. The anodic membrance is brought into contact with a microwave excited plasma of a precursor gas using an electron cyclotron resonance chemical vapor deposition (ECR-CVD) system. Parallel aligned nanosubstances can be synthesized in the channels of the membrane over a large area. Carbon nitride nanosubstances are synthesized successfully for the first time in the present invention.

16 Claims, 7 Drawing Sheets

PROCESS FOR SYNTHESIZING ONE-DIMENSIONAL NANOSUBSTANCES BY ELECTRON CYCLOTRON RESONANCE CHEMICAL VAPOR DEPOSITION

BACKGROUND OF THE INVENTION

1. Field of the Invention

The present invention relates to a process for synthesizing one-dimensional nanosubstances (nanometer-scale substances), and more particularly to a process for synthesizing nanosubstances by electron cyclotron resonance chemical vapor deposition (ECR-CVD). Carbon nitride nanosubstances are synthesized successfully for the first time in the present invention.

2. Description of the Prior Art

There is much interest in carbon based electron field emitters as a new electron source for flat panel display devices, electronic devices, and so on. Electron field emission from bulk substances such as diamond, nitrogenated diamond, cesiated (cesium-treated) diamond and amorphous carbon have been reported at moderately low electric fields.

In 1991, carbon nanotubes (nanometer-scale tubes), which consist of one or more concentric cylindrical shells of graphitic sheets and are typically closed at each end, were produced for the first time in high current arcs (about 100 A and about 20 V) using graphite electrodes, see NATURE, "Helical Microtubules of Graphitic Carbon", Iijima, S., Vol. 354, pp. 56–58, Nov. 7, 1991. The diameters are usually on the order of tens of angstroms and the lengths the order of microns. Due to their nanometer scale dimensions and high aspect ratios, carbon nanotubes constitute a new structure for field-emission electron sources.

In 1996, a smooth carbon and nitrogen containing film able to emit electrons at fields of 4 V $\mu m^{-1}$ was reported in APPLIED PHYSICS LETTERS, "Nitrogen Containing Hydrogenated Amorphous Carbon for Thin-Film Field Emission Cathodes", Amaratunga, G. A. J. and Silva, S. R. P., Vol. 68, No. 18, pp. 2529, Apr. 29, 1996. Nitrogenation of a-C:H has been investigated because there is growing evidence showing that nitrogen acts as an n-type dopant in amorphous carbon and, therefore, has the potential of increasing the current density available from a-C:H cathodes. Further reported was that the self-texturing a-C:H:N films, by virtue of their composition and texturing, give rise to enhanced field emission with current densities $>10^{-4}$ A $cm^{-2}$ at low electric fields ($E_{thr}<7$ V/$\mu m$). This research indicated that the smooth amorphous carbon nitride films already have the electron emission ability, and the results were further described in APPLIED PHYSICS LETTERS, "Self-Texturing of Nitrogenated Amorphous Carbon Thin Films for Electron Field Emission", Silva, S. R. P., Amaratunga, G. A. J. and Barnes, J. R., Vol. 71, No. 11, pp. 1477–1479, Sep. 15, 1997. Just like carbon nanotubes, the carbon nitride nanotubes are expected to be a novel electron source for field emission.

In the synthesis of carbon nanotubes by arc discharge, it is still difficult to control their size and orientation. This fact restricts investigation of both the properties and applications of the nanotubes. Therefore, several methods for nanotube alignment have been developed. The first method was described in SCIENCE, "Aligned Carbon Nanotube Films: Production and Optical and Electronic Properties", W. A. de Heer, et al., Vol. 268, May 12, 1995. Aligned carbon nanotube films were produced by drawing the suspension, which contained powdery nanotubes (widths 10±5 nm, lengths 1–5 $\mu m$) in ethanol, through a "0.2-$\mu m$-pore ceramic filter" (may be an anodic aluminum membrane) and then transferring the black deposit onto a plastic surface.

Another method was reported in SCIENCE, "Large-Scale Synthesis of Aligned Carbon Nanotubes", Li, W. Z. et al., Vol. 274, Dec. 6, 1996. By decomposition of acetylene at 700° C., aligned carbon nanotubes (diameters ~30 nm) were formed on a mesoporous silica containing iron nanoparticles embedded in the pores by a sol-gel process.

The latest literature for the preparation of aligned carbon nanotubes was published in APPLIED PHYSICS LETTERS, "Epitaxial Carbon Nanotube Film Self-Organized by Sublimation Decomposition of Silicon Carbide", Kusunoki, M., Rokkaku, M. and Suzuki, T., Vol. 71, No. 18, Nov. 3, 1997. By sublimation decomposition of silicon carbide at 1700° C. and the use of YAG laser heating in a transmission electron microscopy (TEM), carbon nanotubes with 2–5 nm width were oriented along the [111] direction on the (111) surface plane of β-SiC single crystal.

The major drawbacks of these prior art processes are that they are all complicated and still do not feasibly allow the measurement of the transport properties of aligned carbon nanotubes with the same lengths across the films, which is important when using nanotubes as practical field emission sources.

In addition, no one has ever successfully synthesized parallel aligned one-dimensional carbon nitride nanosubstances.

SUMMARY OF THE INVENTION

An object of the present invention is to solve the above-mentioned problems and to provide a simple process for synthesizing parallel aligned one-dimensional nanosubstances over a large area.

Another object of the present invention is to provide a method for controlling the length of the one-dimensional nanosubstances.

A further object of the present invention is to provide one-dimensional carbon nitride nanosubstances which are parallel aligned.

To achieve the above object, the process for synthesizing one-dimensional nanosubstances comprises contacting a membrane having a plurality of parallel aligned through channels with a microwave excited plasma of a precursor gas using an electron cyclotron resonance chemical vapor deposition (ECR-CVD) system to form the one-dimensional nanosubstances in the channels of the membrane by chemical vapor deposition of the precursor gas.

The nanosubstances are synthesized under the following conditions: a microwave power of 400 to 1000 W, a pressure of $5 \times 10^{-3}$ torr to $20 \times 10^{-3}$ torr, a bias voltage of 0 to –500 V, and a temperature of 15° C. to 1000° C.

The channel of the membrane has a diameter of 30 nm to 350 nm.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PRESENT INVENTION

The present invention provides a novel and simple process for synthesizing one-dimensional nanosubstances. A membrane having a plurality of parallel aligned through channels serves as a host material. In an electron cyclotron resonance chemical vapor deposition (ECR-CVD) system, the membrane is brought into contact with a microwave excited plasma of a precursor gas. Thus, chemical vapor deposition of the precursor gas results in the formation of one-dimensional nanosubstances in the channels of the membrane.

The nanosubstances are preferably synthesized under the following conditions: a microwave power of 400 to 1000 W, a pressure of $5 \times 10^{-3}$ torr to $20 \times 10^{-3}$ torr, a bias voltage of 0 to −500 V, and a temperature of 15° C. to 1000° C. The channel of the membrane is in nanometer scale and preferably has a diameter of 30 nm to 350 nm.

The membrane having straight through nanochannels is for the first time used as a host material for synthesizing aligned nanosubstances. The so-called parallel aligned through channels mean that the channels are open at two ends and tubular. Preferably, the membrane has a pore density of $10^9$ to $10^{10}$ channels/cm$^2$. Suitable channels-having membranes include anodic alumina membranes, silica membranes, and polymeric membranes.

An example of such channels-having membranes is a commercially available $Al_2O_3$ membrane (anodic alumina membrane), ANOPORE™ manufactured and sold by Whatman Laboratory, Inc. The preparation of such material is described by R. C. Furneaus et al., Nature, Vol. 337, p.147 (1989). An alternative matrix material can be made by co-drawing bundled glass rods containing etchable cores. See Tonucci et al., Science, Vol. 258, p.783 (1992). Submicron-sized parallel holes, as fine as about 1000 Å in diameter, are relatively easily obtained. In addition to these ceramic materials, the matrix can be made of polymeric materials such as plastics. For example, suitable polycarbonate-based PCTE (Poretics polycarbonate track-etch) filter membranes are manufactured by Poretics Corp.

According to the present invention, the precursor gas can be dissociated to ions under the above-mentioned ECR system. A high percentage of dissociation of the precursor gas occurring under the ECR system provides a higher plasma density at lower temperatures than other more conventional processes, e.g., rf, dc or microwave plasma enhanced chemical vapor deposition (CVD) systems. Therefore, a large amount of ion flux can pass through the channels of the membrane, and nanosubstances can be synthesized in the channels over a large area (∼1 cm$^2$).

Moreover, the application of a negative dc bias to the membrane can promote the probability of ions bombarding the host material. This results in a relatively low probability for intermolecular collision of the gaseous radicals in the ion flux. The chemical reaction for the nucleation and growth of the precursor gas can easily take place on the walls of the channels. Also, gaseous radicals can be adsorbed onto the channel walls of the membrane by reaction with the OH groups of the channel wall, thus starting the chemical deposition. By means of a special chemical vapor deposition system provided by both the membrane having nanochannels and negative bias voltage under the ECR conditions, parallel aligned one-dimensional nanosubstances can be successfully synthesized.

According to the ECR-CVD system of the present invention, different nanosubstances can be synthesized by using a suitable precursor gas. For example, possible nanosubstances include carbon-based nanosubstances, silicon nanosubstances, GaN nanosubstances, BCN nanosubstances, and tungsten nanosubstances. Carbon nitride nanosubstances which have not previously been synthesized by anyone have now been successfully is synthesized in the present invention.

When the precursor gas includes carbon-containing gas, carbon-based nanosubstances can be synthesized according to the process of the present invention. If only a carbon-containing gas is used, carbon nanosubstances can be synthesized. The carbon-containing gas can be a hydrocarbon gas ($C_xH_y$, x and y are positive integers), such as methane, ethane, propane, acetylene, benzene, and mixtures thereof.

When the precursor gas includes a carbon-containing gas and a nitrogen-containing gas, carbon nitride nanosubstances can be synthesized according to the process of the present invention. The carbon-containing gas can be those as described above. The nitrogen-containing gas can be nitrogen gas ($N_2$) or ammonia gas ($NH_3$).

When one desires to synthesize silicon nanosubstances, a silicon-containing gas such as a silane ($Si_xH_y$, x and y are positive integers) can be used as the precursor gas. A representative example is silicane ($SiH_4$). When one desires to synthesize GaN nanosubstances, a gas mixture of a nitrogen-containing gas and a gallium-containing gas can be used as the precursor gas. The nitrogen-containing gas can be one of those described above, and a representative example of the gallium-containing gas is $GaCl_3$. When one desires to synthesize BCN nanosubstances, a gas mixture of a boron-containing gas, a carbon-containing gas, and a nitrogen-containing gas can be used. A representative example of the boron-containing gas is $BCl_3$. If one desires to synthesize tungsten nanosubstances, a tungsten-containing gas such as $WO_3$ can be used as the precursor gas.

The ECR-CVD process of the present invention is preferably conducted in the presence of an activating gas besides the precursor gas in order to increase the dissociation rate of the precursor gas and to make the plasma more activated.

The activating gas can be an inert gas such as helium, neon, argon, krypton, or xenon.

According to the present invention, the so-called one-dimensional nanosubstance can be in the form of a hollow nanotube or a solid nanofiber, which can be controlled by the reaction conditions of the ECR-CVD such as the flow rate of the precursor gas, the bias voltage, or the reaction temperature. In addition, the length of the nanotube or nanofiber can also be controlled by the reaction conditions of the ECR-CVD and by the thickness of the membrane.

The channels of the membrane are preferably parallel aligned parallel aligned through channels. Thus, the one-dimensional nanosubstances obtained will be parallel aligned.

The present invention is the first time one-dimensional carbon nitride nanosubstances have been successfully synthesized. The carbon nitride nanosubstances synthesized in the present invention are a plurality of parallel aligned nanosubstances. Each nanosubstance has a diameter of 20 to 230 nm and a length of 20 to 300 µm, and the distance between two adjacent nanosubstances is 10 to 800 nm. Such carbon nitride nanosubstances can be in the form of hollow nanotubes or solid nanofibers.

The following example is intended to illustrate the process and the advantages of the present invention more is fully without limiting its scope, since numerous modifications and variations will be apparent to those skilled in the art.

EXAMPLE 1

Figure 1:
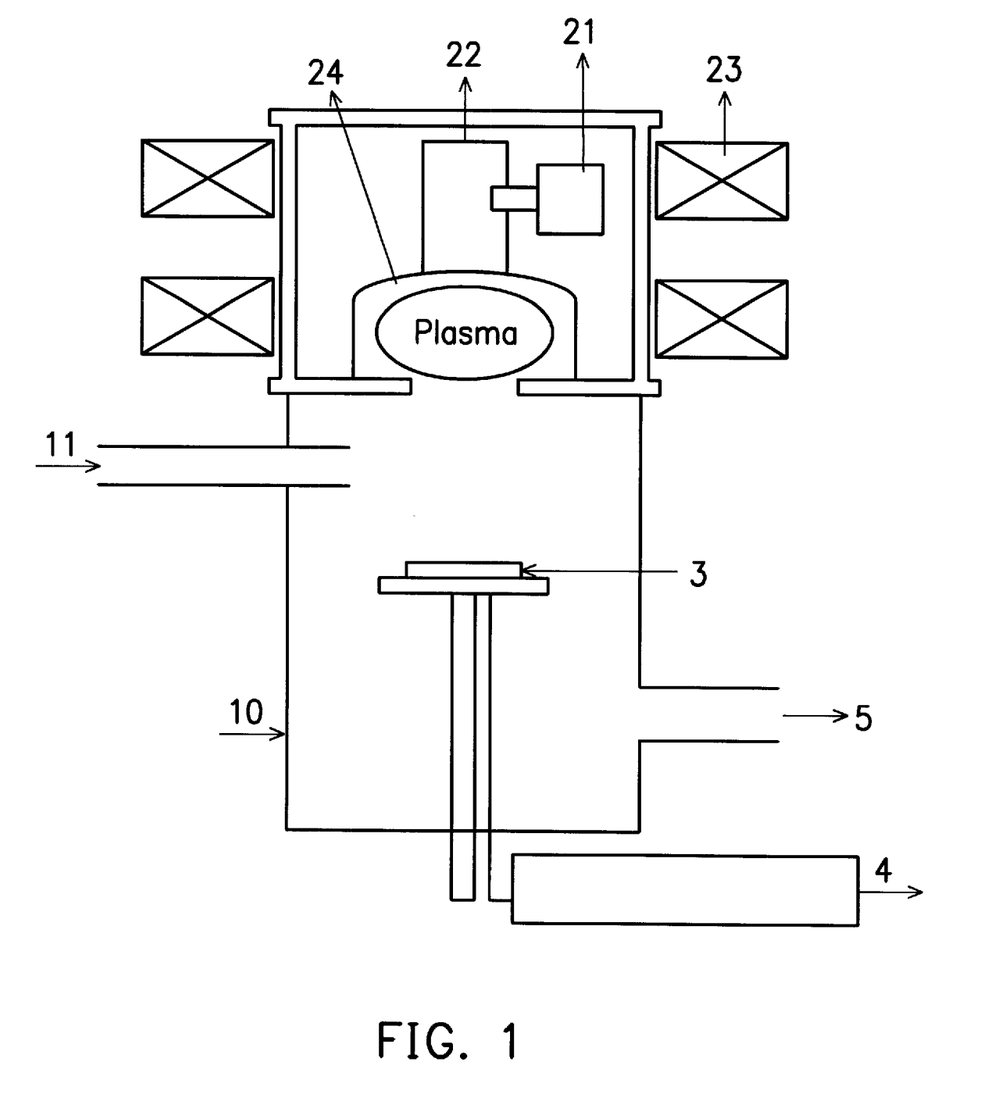
FIG. 1 shows the electron cyclotron resonance chemical vapor deposition (ECR-CVD) system used in the present invention.

The ECR-CVD system used in the example is shown in FIG. 1. The source (plasmodule stream) of the ECR plasma system used in this work was mounted on the flange of a stainless steel vacuum chamber 10 and was covered with a quartz cover 24. Microwaves having a frequency of 2.45 GHz generated by a magnetron 21 were transferred perpendicularly into an 875 Gauss magnetic field generated by coils 23 via a waveguide 22. Thus, the precursor gas entering from a gas inlet 11 was excited to form plasma.

The dc bias voltage was provided by a power supply 4 and was applied to the host material 3. The vacuum chamber was pumped down to a base pressure of $5\times10^{-6}$ torr with a turbomolecular pump 5, backed by a rotary mechanical pump ($\sim10^{-3}$ torr) (not shown).

Figure 2A:
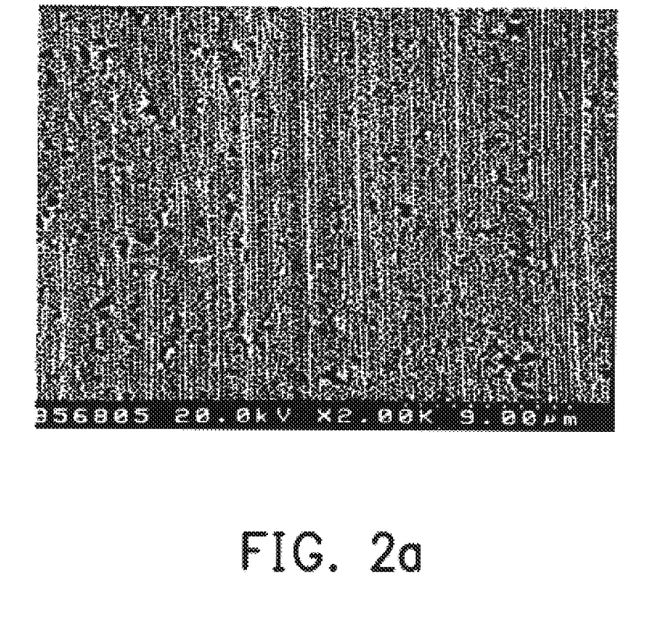
FIG. 2(a) and FIG. 2(b) shows photographs of the anodic alumina membrane used in an example of the present invention, taken by a microscope at different magnifications.
Figure 2B:
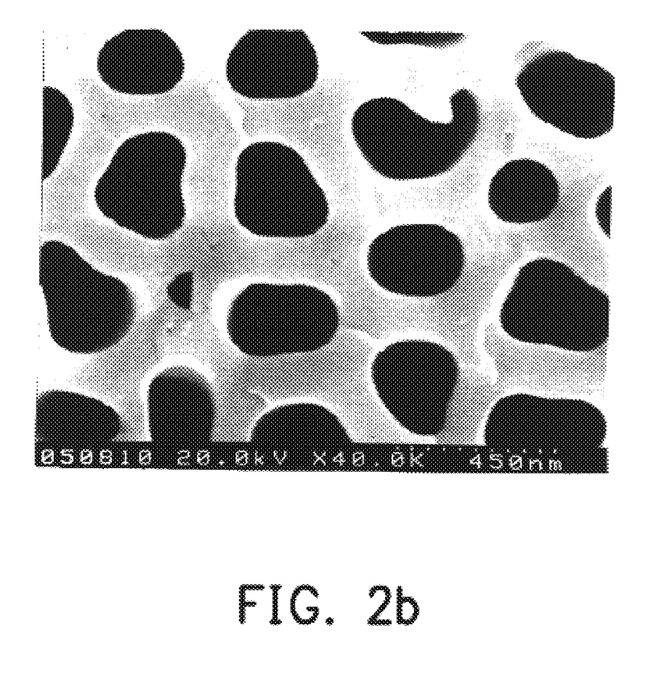

The host material used was anodic alumina membrane, which was prepared by the anodic oxidation of aluminum foil (purity 99.99%) in aqueous phosphoric and oxalic acid mixtures under a constant voltage. FIG. 2 shows the photographs of the anodic alumina membrane used in this example, taken by a microscope at different magnifications. From the figure, it can be seen that the anodic alumina membrane has parallel aligned, uniform through channels. The diameter of the channel is dependent upon the voltage during the anodic oxidation, and is in the range of 30 nm and 350 nm. The pore density of the channel is between $10^9$–$10^{10}$ channels/cm$^2$, and the thickness of the anodic alumina membrane is about 50 to 80 µm.

In this example, the synthesis conditions of the ECR-CVD system were: a microwave power of 400–1000 W, a pressure of $5$–$20\times10^3$ torr, a dc bias voltage of 0 to $-500$ V, a flow rate of acetylene of 1 to 50 sccm, a flow rate of argon of 10 to 200 sccm, a synthesis time of 10 sec to 30 min, and a synthesis temperature of 50 to 300° C. Finally, parallel aligned carbon nanotubes were formed in the channels of the anodic alumina membrane.

Figure 3A:
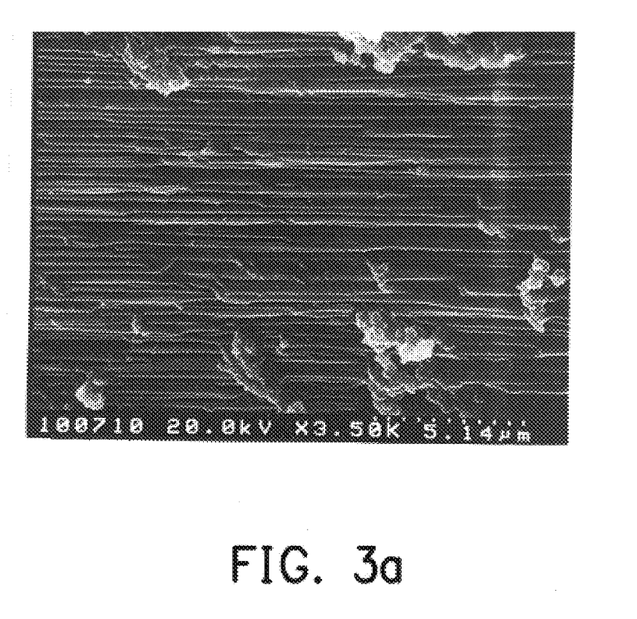
FIG. 3(a) shows a FESEM photograph of the front view of the carbon nanotubes, in which the host material was completely etched.
Figure 3B:
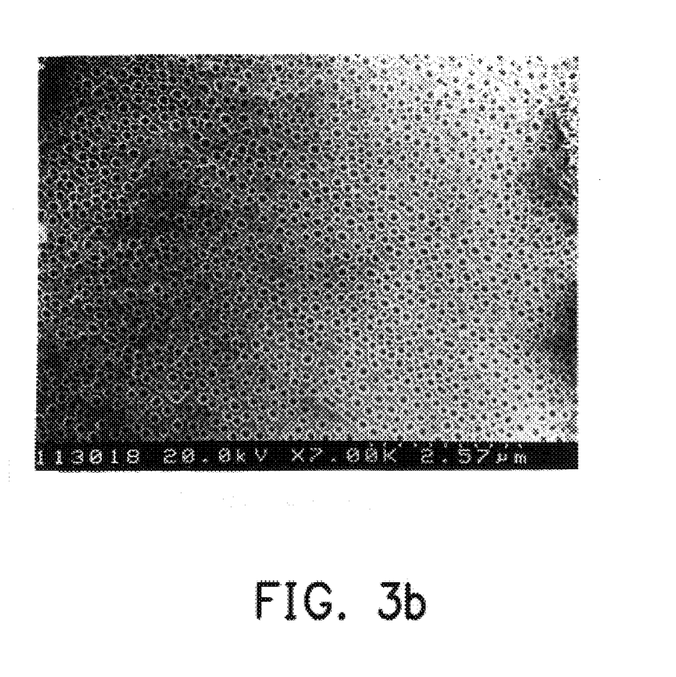
FIG. 3(b) shows a FESEM photograph of the top view of the carbon nanotubes, in which the host material was partially etched.

Field-emission scanning electron microscopy (FESEM) (Hitachi model S-4000) was used to observe the carbon nanotubes. To aid the observation, KOH solution was used to etch the host material either completely or partially. FIG. 3(a) shows a FESEM photograph of the front view of the carbon nanotubes, in which the host material was completely etched. FIG. 3(b) shows a FESEM photograph of the top view of the carbon nanotubes in which the host material was partially etched. From these figures, it can be seen that the carbon nanotubes are hollow and are synthesized in the channels of the anodic alulmina membrane in a parallel aligned pattern.

Figure 4:
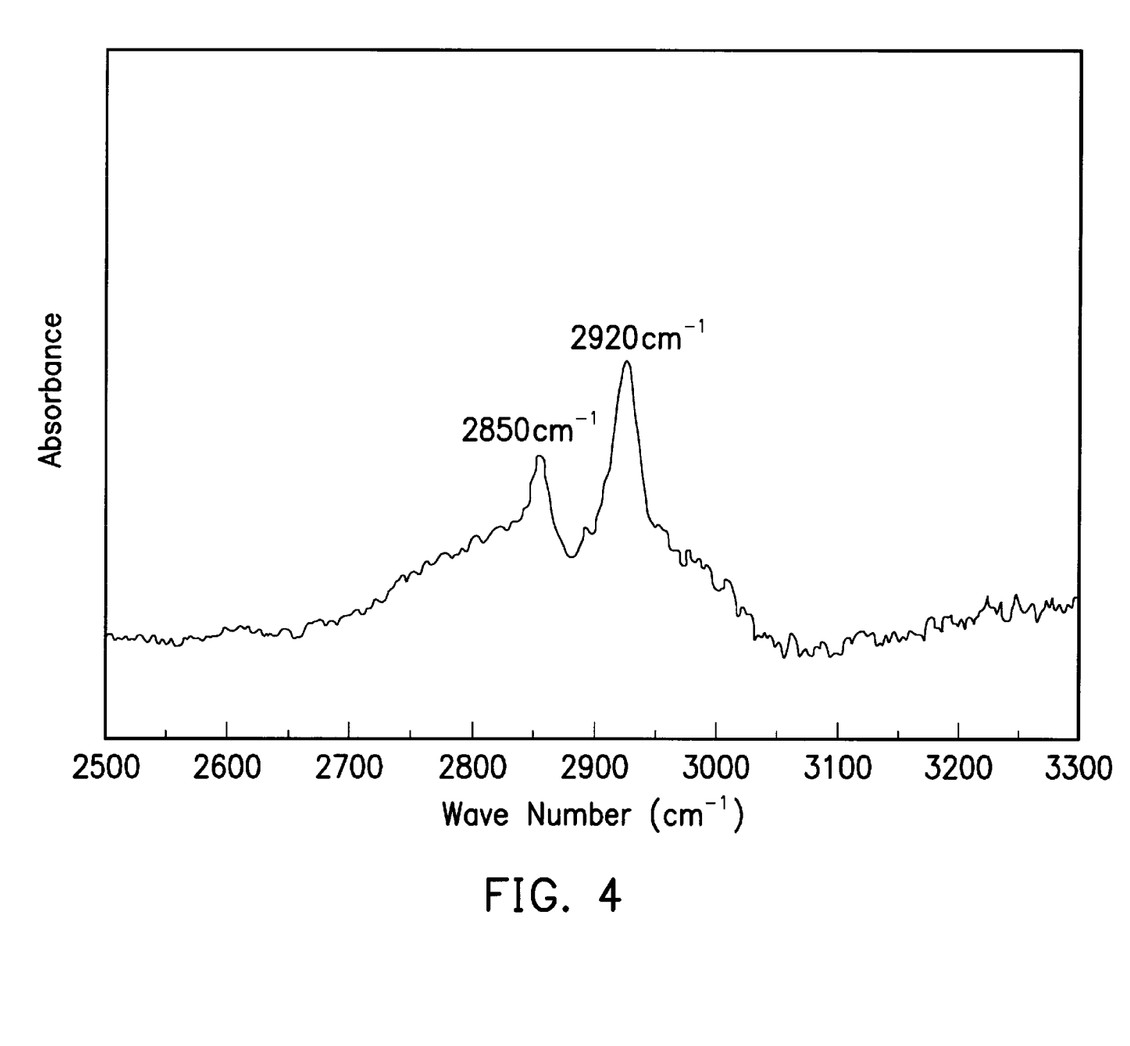
FIG. 4 shows the FTIR spectrum of the carbon nanotubes/ anodic alumina composite membrane synthesized from the present invention.

The Fourier transform infrared spectroscopy (FTIR) was used for the qualitative analysis of the obtained carbon nanotubes/anodic alumina composite membrane. The FTIR spectrum is shown in FIG. 4, indicating that the chemical bonding of the carbon nanotubes is mainly C—H bond.

EXAMPLE 2

The procedures as described in Example 1 were employed except that argon was replaced with nitrogen. The ECR-CVD system and the anodic alumina membrane were the same as in Example 1. Finally, parallel aligned carbon nitride nanotubes were formed in the channels of the anodic alumina membrane.

Figure 5:
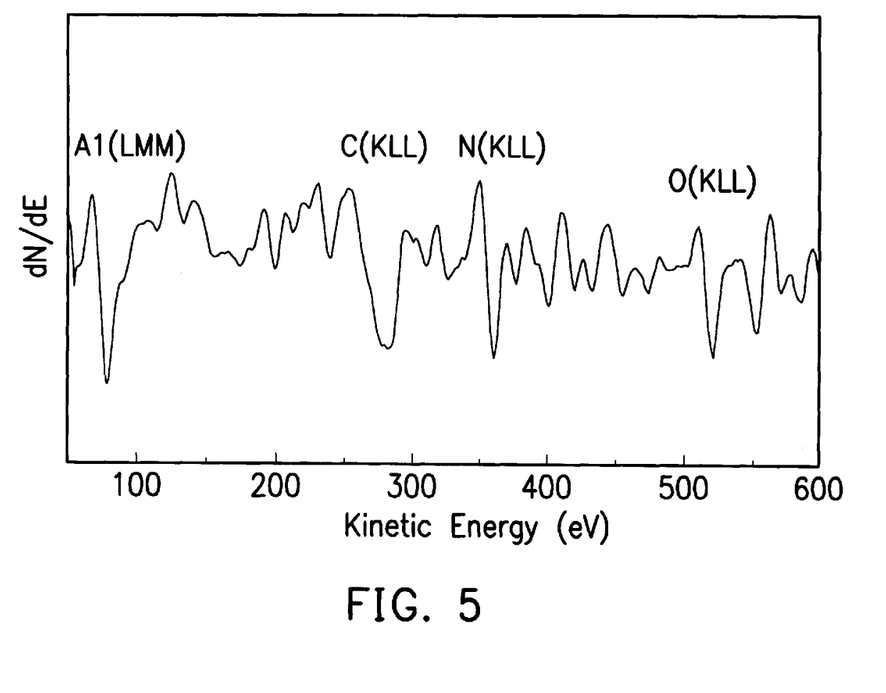
FIG. 5 shows the AES spectrum of the carbon nitride nanotubes/anodic alumina composite membrane synthesized from the present invention.

The cross-sectional surface of the carbon nitride nanotubes/anodic alumina composite membrane was subjected to auger electron spectroscopy (AES) (Perkin Elmer model PHI 670) at 20 kV beam voltage ranging from 50 to 600 eV with 1 eV resolution to determine the chemical elements. The AES spectrum is shown in FIG. 5, exhibiting the peaks of Al(LMM), O(KLL), C(KLL), and N(KLL).

Figure 6:
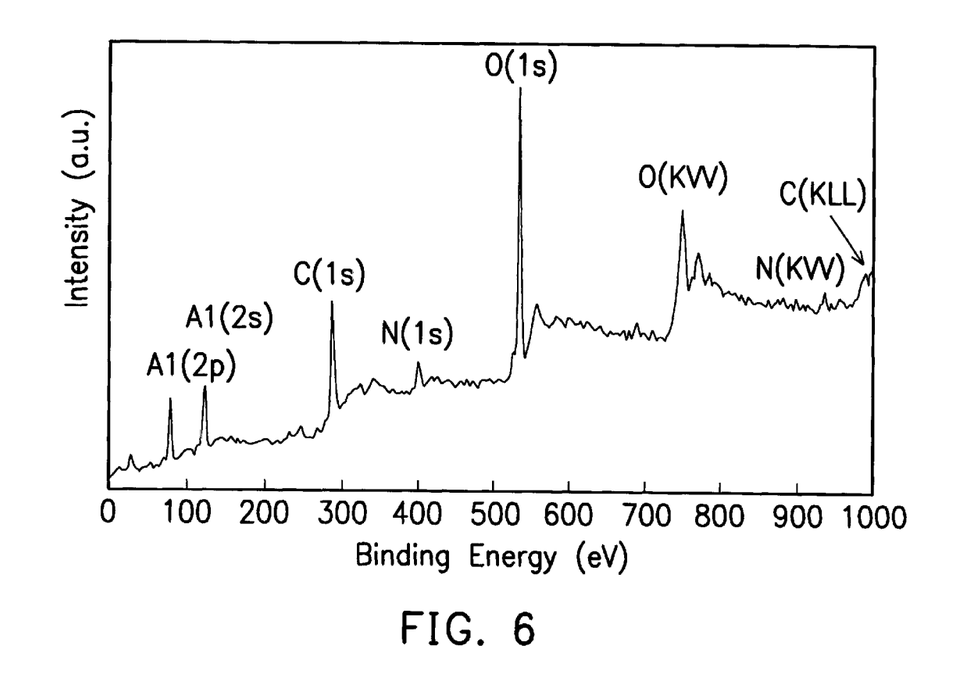
FIG. 6 shows the XPS spectrum of the carbon nitride nanotubes/anodic alumina composite membrane synthesized from the present invention.

FIG. 6 shows the XPS spectrum of the composite membrane, also exhibiting the peaks of Al, O, C, and N. From these two analysis, it can be inferred that the peaks of Al and O come from the anodic alumina membrane, and the peaks of C and N come from the carbon nitride nanotubes synthesized in the anodic alumina membrane.

Figure 7A:
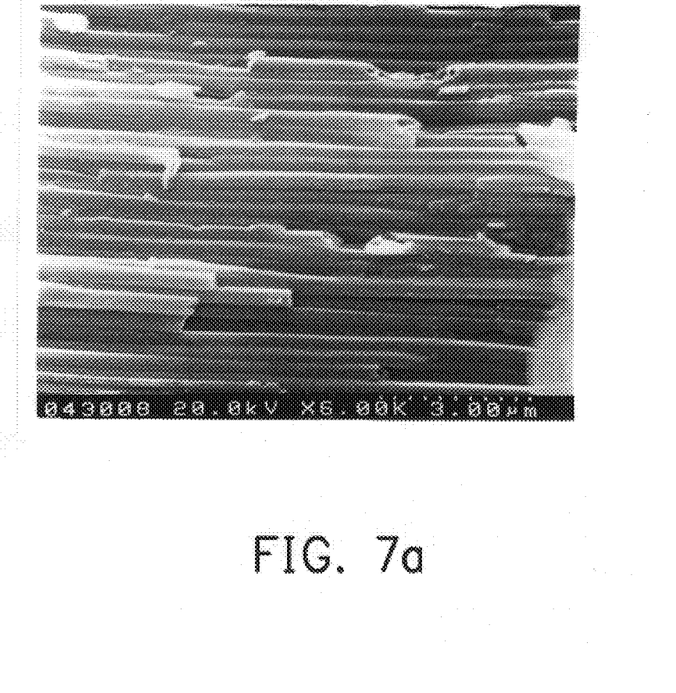
FIG. 7(a) shows a FESEM photograph of the front view of the carbon nitride nanotubes, in which the host material was completely etched.
Figure 7B:
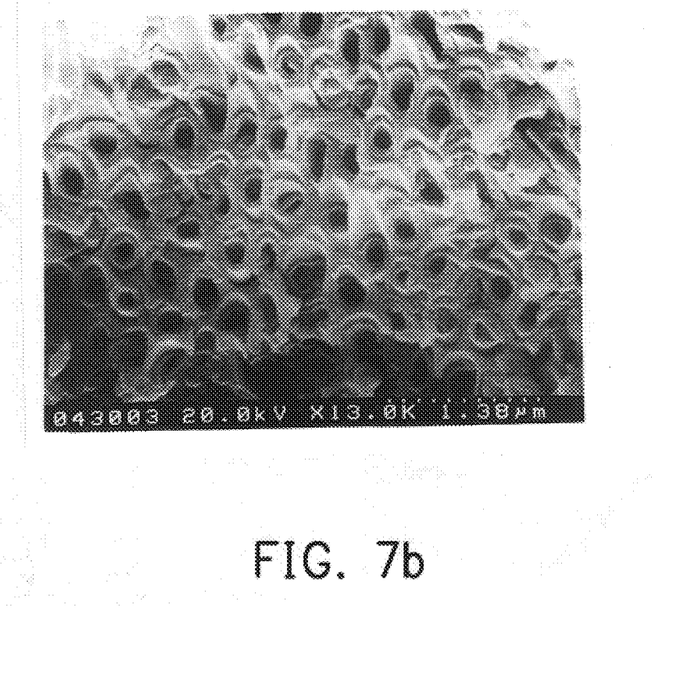
FIG. 7(b) shows a FESEM photograph of the top view of the carbon nitride nanotubes, in which the host material was partially etched.

The composite membrane of carbon nitride nanotubes/anodic alumina was etched by KOH solution either completely or partially, and were then subjected to FESEM analysis. FIG. 7(a) shows a FESEM photograph of the front view of the carbon nitride nanotubes in which the host material was completely etched. FIG. 7(b) shows a FESEM photograph of the top view of the carbon nitride nanotubes in which the host material was partially etched. From these two figures, it can be seen that the carbon nitride nanotubes are hollow and are synthesized in the channels of the anodic alulmina membrane in a parallel aligned pattern.

Figure 8:
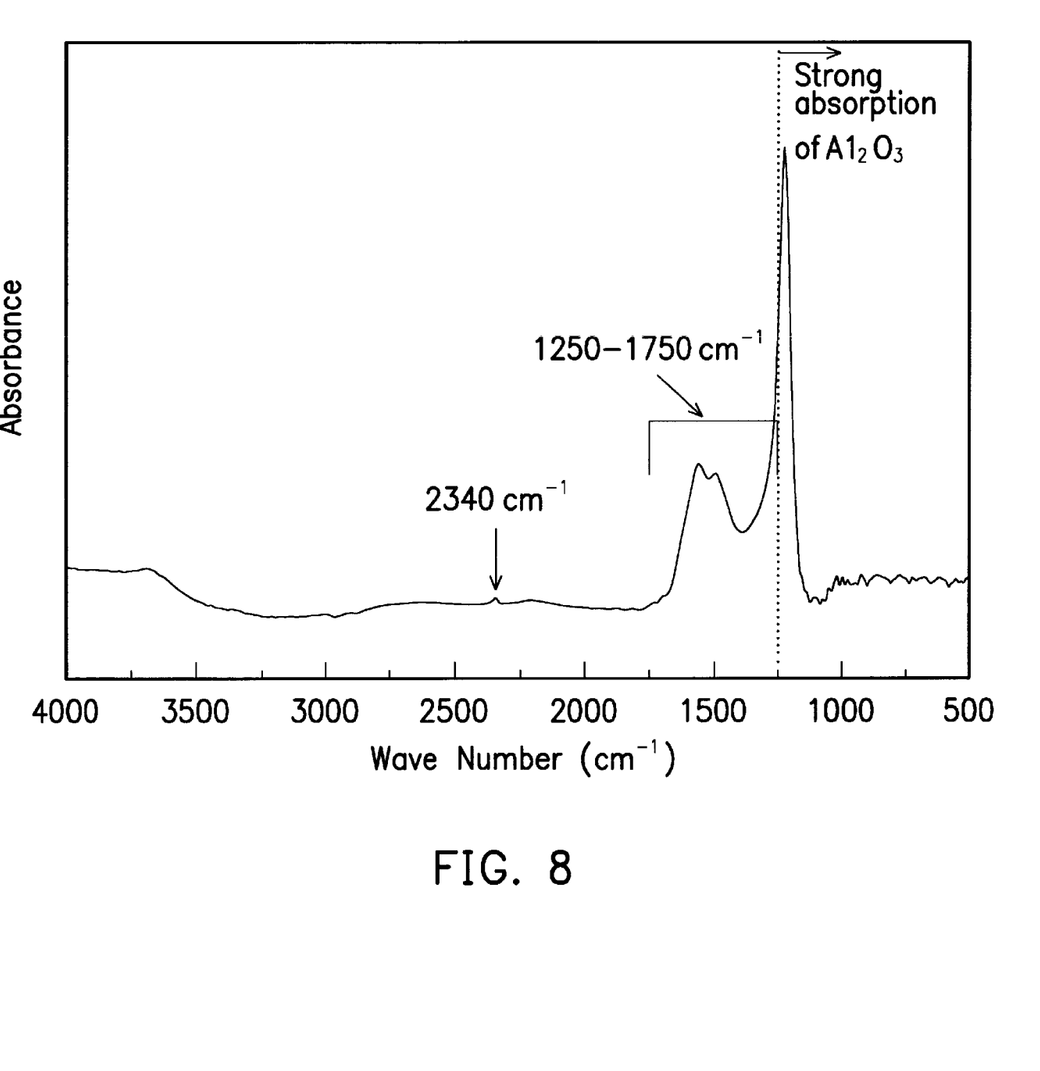
FIG. 8 shows the FTIR spectrum of the carbon nitride nanotubes/anodic alumina composite membrane synthesized from the present invention.

The composite membrane was subjected to FTIR analysis and the spectrum is shown in FIG. 8. The spectrum at wave numbers below 1250 cm$^{-1}$ is dominated by the strong IR absorption of the anodic alumina membrane. The absorption band between 1250 and 1750 cm$^{-1}$ results from the superimposition of the NH and CH bending vibrations and is strong evidence for the incorporation of nitrogen into the amorphous carbon network.

From the above two examples, it can be seen that parallel aligned carbon nanotubes or carbon nitride nanotubes with a uniform diameter were successfully synthesized in the host material of an anodic alumina membrane under a dc bias by ECR-CVD.

What is claimed is:

1. A process for synthesizing parallel-aligned one-dimensional nanosubstances, comprising contacting a membrane having a plurality of parallel aligned through channels with a microwave excited plasma of a precursor gas using an electron cyclotron resonance chemical vapor deposition (ECR-CVD) system under a microwave power of 400 to 1000 W, a pressure of $5\times10^{-3}$ torr to $20\times10^{-3}$ torr, a bias voltage of 0 to −500 V, and a temperature of 15° C. to 1000° C. to form the one-dimensional nanosubstances in the channels of the membrane by chemical vapor deposition of the precursor gas, wherein the channels of the membrane have a diameter of 30 nm to 350 nm.

2. The process as claimed in claim 1, wherein the membrane has a pore density of $10^9$ to $10^{10}$ channels/cm$^2$.

3. The process as claimed in claim 1, wherein the membrane is selected from the group consisting of anodic alumina membranes, silica membranes, and polymeric membranes.

4. The process as claimed in claim 3, wherein the membrane is an anodic alumina membrane.

5. The process as claimed in claim 1, wherein the precursor gas comprises carbon-containing gas, and the nanosubstance is a carbon-based nanosubstance.

6. The process as claimed in claim 5, wherein the nanosubstance is a carbon nanosubstances.

7. The process as claimed in claim 6, wherein the precursor gas comprises a hydrocarbon gas.

8. The process as claimed in claim 7, wherein the hydrocarbon gas is selected from the group consisting of methane, ethane, propane, acetylene, benzene, and mixtures thereof.

9. The process as claimed in claim 5, wherein the precursor gas comprises a carbon-containing gas and a nitrogen-containing gas, and the nanosubstance is a carbon nitride nanosubstance.

10. The process as claimed in claim 9, wherein the carbon-containing gas is a hydrocarbon gas.

11. The process as claimed in claim 10, wherein the hydrocarbon gas is selected from the group consisting of methane, ethane, propane, acetylene, benzene, and mixtures thereof.

12. The process as claimed in claim 9, wherein the nitrogen-containing gas is nitrogen gas ($N_2$) or ammonia gas ($NH_3$).

13. The process as claimed in claim 1, wherein the chemical vapor deposition of the precursor gas is conducted in the presence of an activating gas.

14. The process as claimed in claim 13, wherein the activating gas is an inert gas.

15. The process as claimed in claim 14, wherein the inert gas is selected from the group consisting of helium, neon, argon, krypton, and xenon.

16. The process as claimed in claim 1, wherein the one-dimensional nanosubstance is a hollow nanotube or a solid nanofiber.

\* \* \* \* \*